(12) United States Patent
Tsukamoto et al.

(10) Patent No.: US 8,779,546 B1
(45) Date of Patent: Jul. 15, 2014

(54) SEMICONDUCTOR MEMORY SYSTEM WITH BIT LINE AND METHOD OF MANUFACTURE THEREOF

(71) Applicant: Sony Corporation, Tokyo (JP)

(72) Inventors: Masanori Tsukamoto, Boise, ID (US); Satoru Mayuzumi, Boise, ID (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/789,610

(22) Filed: Mar. 7, 2013

(51) Int. Cl.
*H01L 21/70* (2006.01)

(52) U.S. Cl.
USPC ......... 257/506; 257/773; 257/532; 257/332; 257/306; 257/774; 257/213; 438/255; 438/624; 438/197; 438/479; 438/238

(58) Field of Classification Search
CPC .......... H01L 27/10876; H01L 27/10852; H01L 27/10855; H01L 27/11; H01L 27/101; H01L 28/65; H01L 45/04; H01L 27/0805; H01L 21/02178; H01L 27/10808; H01L 27/10811
USPC ......... 257/506, 773, 532, 332, 306, 316, 774, 257/213; 438/255, 624, 197, 479, 238
See application file for complete search history.

(56) References Cited

U.S. PATENT DOCUMENTS

| | | | | |
|---|---|---|---|---|
| 4,958,318 A | * | 9/1990 | Harari | 365/149 |
| 5,359,226 A | * | 10/1994 | DeJong | 257/773 |
| 6,087,218 A | * | 7/2000 | Hong | 438/255 |
| 6,312,982 B1 | * | 11/2001 | Takato et al. | 438/238 |
| 6,392,267 B1 | * | 5/2002 | Shrivastava et al. | 257/316 |
| 6,465,331 B1 | * | 10/2002 | Keeth et al. | 438/479 |
| 6,710,398 B2 | * | 3/2004 | Wu | 257/316 |
| 7,442,988 B2 | * | 10/2008 | Oh et al. | 257/321 |
| 7,936,000 B2 | * | 5/2011 | Tang et al. | 257/302 |
| 8,648,423 B2 | * | 2/2014 | Han et al. | 257/368 |
| 8,653,630 B2 | * | 2/2014 | Liaw et al. | 257/622 |
| 2001/0015452 A1 | * | 8/2001 | Shinkawata | 257/306 |
| 2002/0024093 A1 | * | 2/2002 | Ahn et al. | 257/332 |
| 2002/0030214 A1 | * | 3/2002 | Horiguchi | 257/301 |
| 2003/0107073 A1 | * | 6/2003 | Iijima et al. | 257/296 |
| 2003/0132462 A1 | * | 7/2003 | Iijima et al. | 257/213 |
| 2003/0141601 A1 | * | 7/2003 | Fukuzumi | 257/774 |
| 2003/0143790 A1 | * | 7/2003 | Wu | 438/197 |
| 2004/0150028 A1 | * | 8/2004 | Horiguchi | 257/306 |
| 2006/0028855 A1 | * | 2/2006 | Matsunaga et al. | 365/145 |
| 2009/0008744 A1 | * | 1/2009 | Nishi | 257/532 |

(Continued)

OTHER PUBLICATIONS

Lee, "Upcoming Challenges in DRAM Manufacturing", "Process Outlook Forum Mar. 9, 2004", Mar. 9, 2004, pp. 1-27, Publisher: Samsung Electronics (http://spares.fsi-intl.com/seminar/materials/2004_03_09.pdf).

*Primary Examiner* — Fernando L Toledo
*Assistant Examiner* — Mohammed Shamsuzzaman
(74) *Attorney, Agent, or Firm* — Ishimaru & Associates LLP (57) ABSTRACT

A semiconductor memory system and method of manufacture thereof including: a base wafer; an isolation region on the base wafer; an ion implanted region on the base wafer separated by the isolation region; a bit line contact plug over the ion implanted region; an isolation sidewall on the sides of the bit line contact plug; a resistor or capacitor on the isolation sidewall opposite the bit line contact plug between the bit line contact plug and another of the bit line contact plug; and a bit line over the resistor or capacitor and on the bit line contact plug.

18 Claims, 5 Drawing Sheets

(56) References Cited

U.S. PATENT DOCUMENTS

| | | | |
|---|---|---|---|
| 2009/0207649 A1* | 8/2009 | Tang et al. | 365/149 |
| 2011/0018141 A1* | 1/2011 | Paik | 257/774 |
| 2011/0291239 A1* | 12/2011 | Nishi | 257/532 |
| 2012/0058637 A1* | 3/2012 | Hirota | 438/624 |
| 2012/0074518 A1* | 3/2012 | Kim et al. | 257/506 |
| 2012/0248519 A1* | 10/2012 | Shinhara | 257/296 |
| 2012/0306081 A1* | 12/2012 | Ishizaki et al. | 257/751 |
| 2013/0154101 A1* | 6/2013 | Park | 257/773 |

* cited by examiner

SEMICONDUCTOR MEMORY SYSTEM WITH BIT LINE AND METHOD OF MANUFACTURE THEREOF

TECHNICAL FIELD

The present invention relates generally to a semiconductor memory system, and more particularly to a random access memory system.

BACKGROUND ART

The demands of consumer electronics are always increasing, and demand more solid state memory, including flash memory, ReRAM (Resistance Random Access Memory), and DRAM (Dynamic Random Access Memory). Solid state memory is generally composed of a number of memory cells. Due to ever-shrinking size requirements for smaller and smaller devices, and the physical size of each memory cell, a number of techniques have been developed to decrease the size of each memory cell.

One technique is to use an etching process to form a bit line through a resistor or capacitor, which reduces memory cell size, but also damages the material of the memory cell due to the etch process. Another technique is to use a damascene process which avoids damage to the material of the memory cell, but this makes it difficult to isolate the bit line and the resistor or capacitor without creating a larger memory cell.

Thus, a need still remains for a better semiconductor memory system and method of manufacture. In view of the push to ever-smaller devices and higher density memory, it is increasingly critical that answers be found to these problems. In view of the ever-increasing commercial competitive pressures, growing consumer expectations, and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of semiconductor memory system including: forming an isolation region having contact holes on a base wafer including forming an ion implanted region in the contact holes; depositing a bit line contact plug in one of the contact holes; removing a portion of the isolation region from between the bit line contact plug and another of the bit line contact plug including forming an isolation sidewall of the isolation region in direct contact with sides of the bit line contact plug; forming a resistor or capacitor on the isolation sidewall opposite the bit line contact plug between the bit line contact plug and another of the bit line contact plug; and forming a bit line on the bit line contact plug and over the resistor or capacitor.

The present invention provides a semiconductor memory system, including: a base wafer; an isolation region on the base wafer; an ion implanted region on the base wafer separated by the isolation region; a bit line contact plug over the ion implanted region; an isolation sidewall on the sides of the bit line contact plug; a resistor or capacitor on the isolation sidewall opposite the bit line contact plug between the bit line contact plug and another of the bit line contact plug; and a bit line over the resistor or capacitor and on the bit line contact plug.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements.

For expository purposes, the term "horizontal" as used herein is defined as a plane parallel to the plane or surface of the ion implanted region initially exposed in the contact hole, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure. Wavy lines in the figures are used to show that only a portion of the structure is shown, and the figures are in no way to be construed to limit the invention to a particular number of bit line contact plugs or any particular configuration.

Figure 1A:
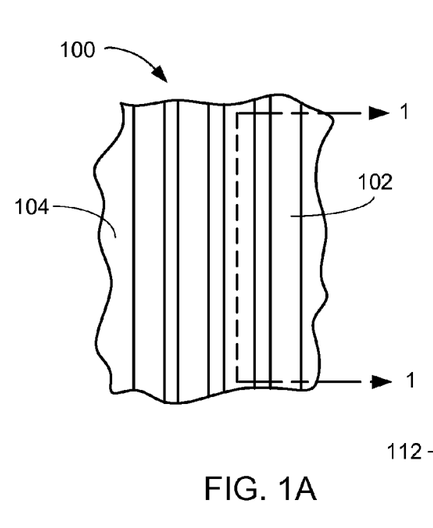
FIG. 1A is a top view of a semiconductor memory system in an embodiment of the present invention.

Referring now to FIG. 1A, therein is shown a top view of a semiconductor memory system 100 in an embodiment of the present invention. The semiconductor memory system 100, such as a semiconductor memory device, is shown having a bit line 102 and an isolation layer 104. The bit line 102 is a conductive structure and is composed of, for example, copper, aluminum, tungsten, or alloys thereof. The exposed surface of the bit line 102 can have scratches or abrasions characteristic of a chemical mechanical planarization/polishing (CMP) process. The isolation layer 104 can be coplanar with the bit line 102 and can isolate the other portions of the semiconductor memory system 100. The isolation layer 104 can be an insulator and can be formed from silicon dioxide, for example.

Figure 1B:
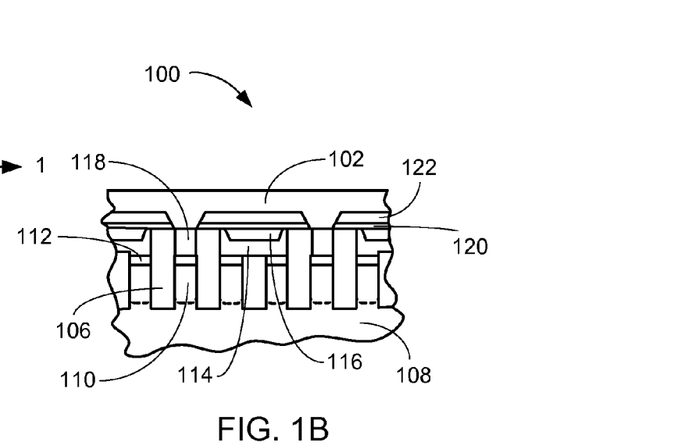
FIG. 1B is a cross-sectional view of the semiconductor memory system along the section line 1-1 of FIG. 1A.

Referring now to FIG. 1B, therein is shown a cross-sectional view of the semiconductor memory system 100 along the section line 1-1 of FIG. 1A. The semiconductor memory system 100, such as a semiconductor memory device, is shown having the bit line 102, an isolation region 106, a portion of a base wafer 108, an ion implanted region 110, a node contact 112, a resistive or capacitive film 114, a metal film 116, a bit line contact plug 118, a lower dielectric layer 120, and an upper dielectric layer 122.

The ion implanted region 110 and the isolation region 106 are on the base wafer 108, which can be made of silicon. The various portions of the ion implanted region 110 are separated and electrically isolated by the isolation region 106, which can be an insulator such as silicon nitride. As an example, the ion implanted region 110 can be formed as an N+ type doped region by using arsenic and phosphorus for ion implantation. The bottom of the ion implanted region 110 is indicated by dotted lines. The node contact 112 is directly on the top surface of the ion implanted region 110, and can be made from a conductive material such as a combination of titanium and titanium nitride.

The resistive or capacitive film 114 is in contact with the node contact 112, the isolation region 106, and the metal film 116. The resistive or capacitive film 114 can be made from many different materials depending on its function. For example, the resistive or capacitive film 114 can be a resistor film of a hafnium, titanium, nickel, or aluminum oxide, or other oxide film along with a transition metal such as copper or silver when using the semiconductor memory system 100 as ReRAM. In addition to the transition metals, tellurium can also be used. Also for example, the resistive or capacitive film 114 can be a high-k resistive or capacitive film suitable for use in creating capacitors for use in DRAM. For example, a resistive or capacitive film could be made from $Ta_2O_5$, BST, or PZT.

The metal film 116 is in contact with the resistive or capacitive film 114 and the lower dielectric layer 120. The metal film 116 can be formed from a metal such as copper, aluminum, tungsten, or other metal. Separated from the metal film 116 by the isolation region 106 and the resistive or capacitive film 114 is the bit line contact plug 118. The bit line contact plug 118 forms a portion of the bit line in the semiconductor memory system 100, and can be formed from a material such as tungsten, polysilicon, amorphous silicon, or other conductive materials. The bit line contact plug 118 connects the node contact 112 and the bit line 102.

The bit line 102 is on and over the upper dielectric layer 122 which is on and over the lower dielectric layer 120. The bit line 102 and the bit line contact plug 118 form a self-aligned bit line of the semiconductor memory system 100. The lower dielectric layer 120 and the upper dielectric layer 122 can be formed from various dielectric materials such as silicon oxide and silicon nitride, respectively. The upper dielectric layer 122 can have slanted sides extending down to the bit line contact plug 118 as a result of an etching process. The bit line 102 extends down past the upper dielectric layer 122 to contact the bit line contact plug 118 and a portion of the lower dielectric layer 120, the sides of which are exposed from and under the upper dielectric layer 122.

Figure 2A:
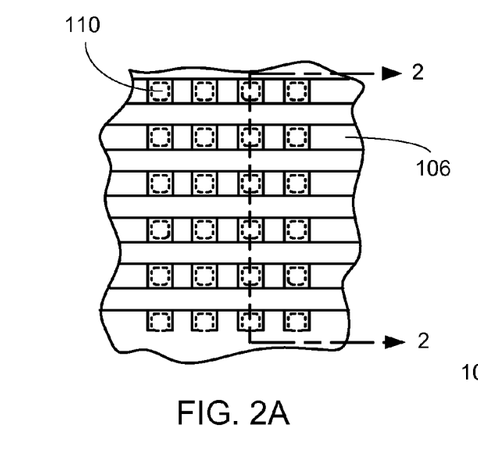
FIG. 2A is a top view of the ion implanted region and an isolation region in a doping phase of manufacturing.

Referring now to FIG. 2A, therein is shown a top view of the ion implanted region 110 and the isolation region 106 in doping phase of manufacturing. The various portions of the ion implanted region 110 are separated by the isolation region 106. The ion implanted region 110 is shown with dotted lines.

Figure 2B:
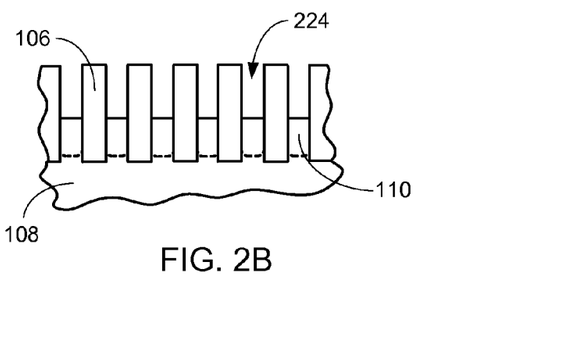
FIG. 2B is a cross-sectional view of the ion implanted region and the isolation region along the section line 2-2 of FIG. 2A.

Referring now to FIG. 2B, therein is shown a cross-sectional view of the ion implanted region 110 and the isolation region 106 along the section line 2-2 of FIG. 2A. The isolation region 106 surrounds the various portions of the ion implanted region 110, which is also recessed below the top surface of the isolation region 106. Both the isolation region 106 and the ion implanted region 110 are on the base wafer 108. For example, a silicon nitride film which is later patterned can be used to form the isolation region 106.

The ion implanted region 110 can be formed in contact holes 224 of the isolation region 106, using, for example, arsenic or phosphorus to form N+ type doped regions. Also for example, the contact holes 224 can be formed with a diameter of 20 to 30 nanometers through a lithography and dry etching process. The contact holes 224 can be in a regular or staggered pattern. The ion implanted region is described as possibly being an N+ type doped region, but it is understood that this is only one example and there are other possibilities. For example, the appropriate dopants can be used to form an N−, P+, or P− type doped region.

Figure 3A:
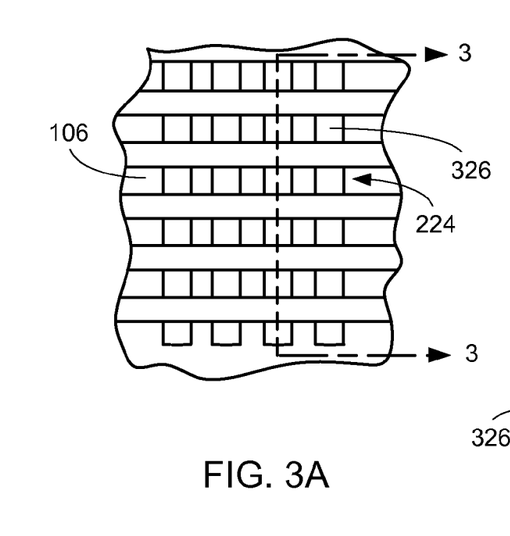
FIG. 3A is a top view of a gap filler and the isolation region in a gap fill phase of manufacturing.

Referring now to FIG. 3A, therein is shown a top view of a gap filler 326 and the isolation region 106 in a gap fill phase of manufacturing. Visible from the top view is the gap filler 326 in the contact holes 224. The gap filler 326 can be a material easily removable via etching or other removal process. For example, the gap filler 326 can be silicon dioxide.

Figure 3B:
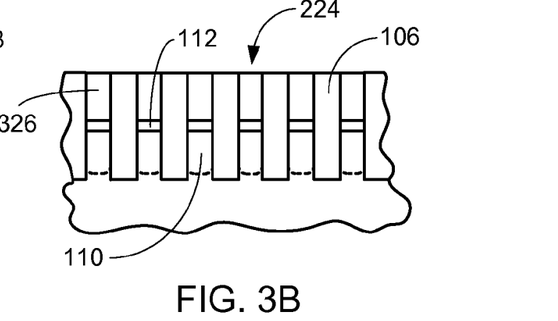
FIG. 3B is a cross-sectional view of the gap filler and the isolation region along the section line 3-3 of FIG. 3A.

Referring now to FIG. 3B, therein is shown a cross-sectional view of the gap filler 326 and the isolation region 106 along the section line 3-3 of FIG. 3A. Before deposition of the gap filler 326, the node contact 112 is formed by a process such as physical vapor deposition (PVD). For example, a film of titanium followed by titanium nitride can be deposited via PVD in the contact holes 224 and on the isolation region 106 and the ion implanted region 110, and then etched back via a dry etch process to leave the node contact 112 on the ion implanted region 110.

After formation of the node contact 112, the gap filler 326 is deposited via a process such as chemical vapor deposition (CVD). After deposition, the top surface of the gap filler 326 and the isolation region 106 can be planarized using a process such as CMP.

Figure 4A:
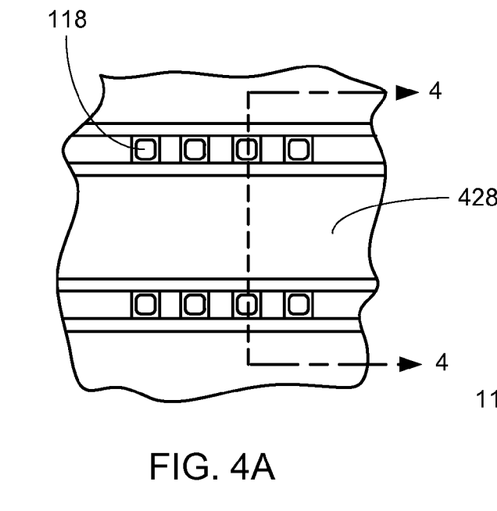
FIG. 4A is a top view of a photoresist and the bit line contact plug in a contact deposition phase of manufacturing.

Referring now to FIG. 4A, therein is shown a top view of a photoresist 428 and the bit line contact plug 118 in a contact deposition phase of manufacturing. The photoresist 428 can be patterned by a lithography process to cover the top surface except for designated bit line contact areas.

Figure 4B:
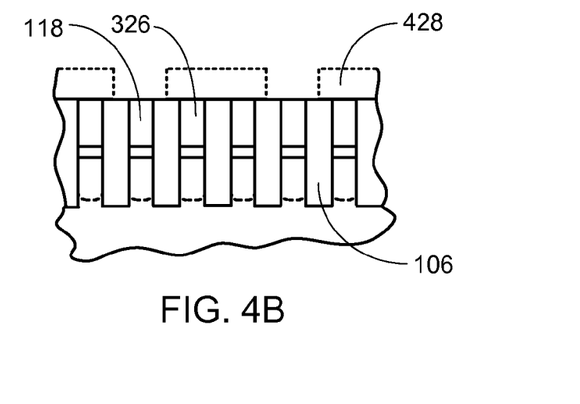
FIG. 4B is a cross-sectional view of the photoresist and the bit line contact plug along the section line 4-4 of FIG. 4A.

Referring now to FIG. 4B, therein is shown a cross-sectional view of the photoresist 428 and the bit line contact plug 118 along the section line 4-4 of FIG. 4A. The gap filler 326 exposed from the photoresist 428 in the bit line contact areas can be removed using a dry etching process.

The photoresist 428 can be stripped, then the bit line contact plug 118 can be deposited using a process such as CVD or PVD. The location of the photoresist 428 prior to removal is shown with dotted lines. The bit line contact plug 118, the gap filler 326, and the isolation region 106 can then be planarized by CMP.

Figure 5A:
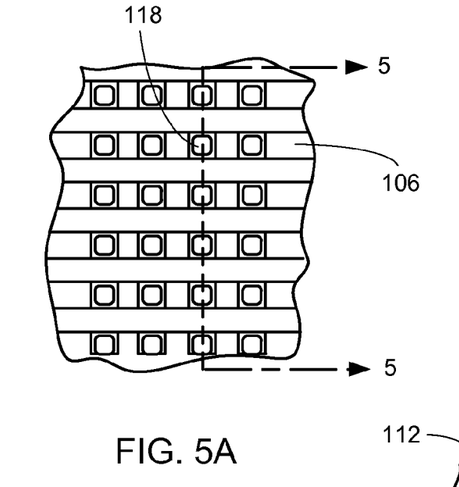
FIG. 5A is a top view of the isolation region and the bit line contact plug in an etching phase of manufacturing.

Referring now to FIG. 5A, therein is shown a top view of the isolation region 106 and the bit line contact plug 118 in an etching phase of manufacturing. The top view shows the photoresist 428 of FIG. 4A removed.

Figure 5B:
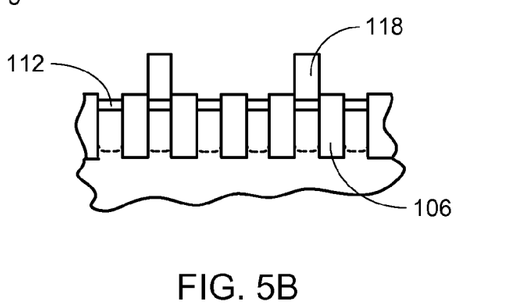
FIG. 5B is a cross-sectional view of the isolation region and the bit line contact plug along the section line 5-5 of FIG. 5A.

Referring now to FIG. 5B, therein is shown a cross-sectional view of the isolation region 106 and the bit line contact plug 118 along the section line 5-5 of FIG. 5A. The portion of the isolation region 106 and the gap filler 326 of FIG. 3A above the node contact 112 can have been removed without removing the node contact 112 or the bit line contact plug 118 using a technique such as etching utilizing a selective etching compound. For example, an etchant that will etch silicon oxides and silicon nitrides without excessively etching tungsten or titanium can be used. The bit line contact plug 118 is then left above the node contact 112 and the isolation region 106.

Figure 6A:
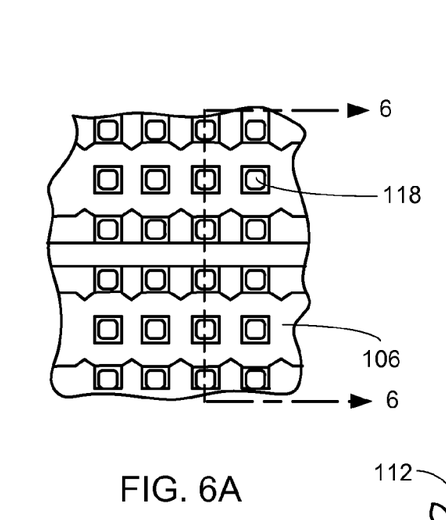
FIG. 6A is a top view of the isolation region and the bit line contact plug in a sidewall formation phase of manufacturing.

Referring now to FIG. 6A, therein is shown a top view of the isolation region 106 and the bit line contact plug 118 in a sidewall formation phase of manufacturing. Additional material can be seen added to the isolation region 106 surrounding the bit line contact plug 118.

Figure 6B:
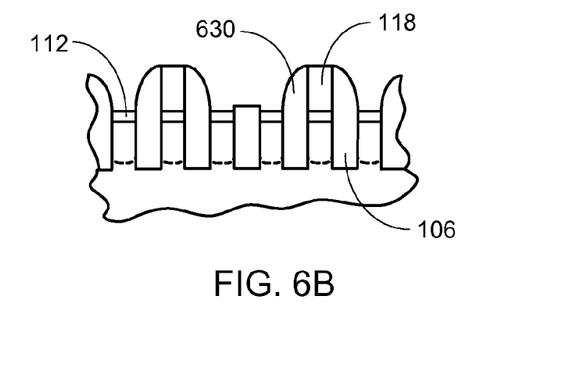
FIG. 6B is a cross-sectional view of the isolation region and the bit line contact plug along the section line 6-6 of FIG. 6A.

Referring now to FIG. 6B, therein is shown a cross-sectional view of the isolation region 106 and the bit line contact plug 118 along the section line 6-6 of FIG. 6A. This view shows the isolation region 106 around the bit line contact plug 118 having an isolation sidewall 630 which is slanted at the top near the top of the bit line contact plug 118. The isolation sidewall 630 of the isolation region 106 can be formed by first adding or depositing material that matches with the material used to make the isolation region 106, such as silicon nitride, to the areas around and over the bit line contact plug 118 using a process such as CVD. The material can then be etched away by a process such as anisotropic etching, using the bit line contact plug 118 as an etch mask, such that the material far from the bit line contact plug 118 is etched farther, exposing the node contact 112 while leaving the isolation sidewall 630 of the isolation region 106 around the bit line contact plug 118. The top of the isolation sidewall 630 can be curved as a result of the etching process.

It has been discovered that using the bit line contact plug 118 as an etch mask and leaving the isolation sidewall 630 of the isolation region 106 around the bit line contact plug 118 allows for a reduction in size of the final memory cell. The isolation sidewall 630 of the isolation region 106 assists in self-alignment of components around the bit line contact plug 118 which allows for lower tolerances between the components and the bit line contact plug 118, thereby reducing the size of the memory cell.

Figure 7A:
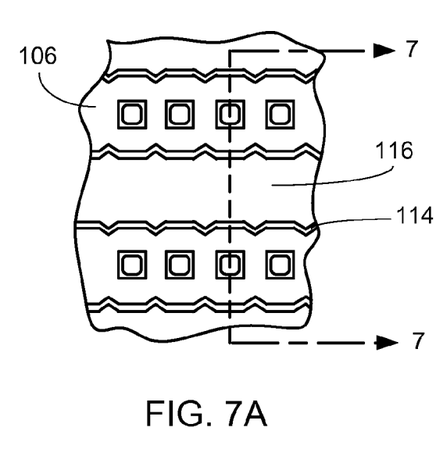
FIG. 7A is a top view of the metal film and the isolation region in a planarization phase of manufacturing.

Referring now to FIG. 7A, therein is shown a top view of the metal film 116 and the isolation region 106 in a planarization phase of manufacturing. The node contact 112 of FIG. 6B is under the metal film 116 and the resistive or capacitive film 114, a small portion of which can be seen around the metal film 116. The surface seen in this top view is planarized using, for example, a CMP process, and can have abrasions or scratches characteristic of CMP.

Figure 7B:
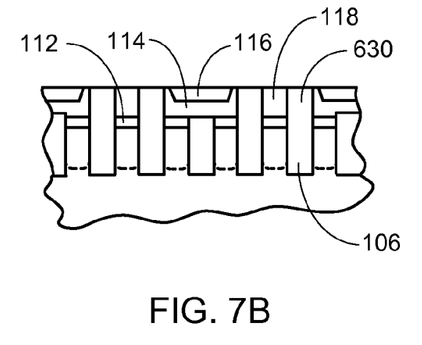
FIG. 7B is a cross-sectional view of the metal film and the isolation region along the section line 7-7 of FIG. 7A.

Referring now to FIG. 7B, therein is shown a cross-sectional view of the metal film 116 and the isolation region 106 along the section line 7-7 of FIG. 7A. Before application or deposition of the resistive or capacitive film 114, the surface of the node contact 112 can be pre-cleaned using a material such as hydrofluoric acid, hydrochloric acid, sulfuric acid, or other suitable treatments. The resistive or capacitive film 114 can be applied using a process such as PVD or CVD, and can cover the isolation sidewall 630 and the node contact 112 while leaving room for the metal film 116 due to even distribution on all surfaces. The resistive or capacitive film 114 can have a central recess with slanted sides.

For illustrative purposes, the shape of the resistive or capacitive film 114 is shown with thinner sidewalls, but it is understood that the resistive or capacitive film 114 can have a different shape. For example, using a CVD process, the resistive or capacitive film 114 will be deposited conformally, and can have sidewalls of the same thickness as the bottom portion.

The metal film 116 is deposited on the resistive or capacitive film 114 via a process such as PVD or CVD, and can sit in the central recess of the resistive or capacitive film 114 that is formed as a result of the deposition process of the resistive or capacitive film 114. The top surface including the bit line contact plug 118, the isolation region 106, a portion of the resistive or capacitive film 114, and the metal film 116 can then be planarized using a process such as CMP.

It has been discovered that the isolation sidewall 630 of the isolation region 106 formed through controlled etching controls the location of the resistive or capacitive film 114 and the metal film 116 allowing for reliable formation of a smaller memory cell than through typical processes. The isolation sidewall 630 around the bit line contact plug 118 and the later CMP control where the resistive or capacitive film 114 contacts the node contact 112, leading to a self-aligned resistor or capacitor, depending on what materials are used. The self-aligned resistor or capacitor allows for lower tolerances between the resistor/capacitor and the bit line contact plug 118 helping to form a smaller memory cell.

It has also been discovered that the deposition of the resistive or capacitive film 114 and the metal film 116 in the space defined by the isolation sidewall 630 means that no etching is done directly on the resistive or capacitive film 114 or the metal film 116 that form the resistor or capacitor, and this lack of etching protects the resistor or capacitor from etching damage while simultaneously gaining the benefit of a self-aligned resistor or capacitor.

Figure 8A:
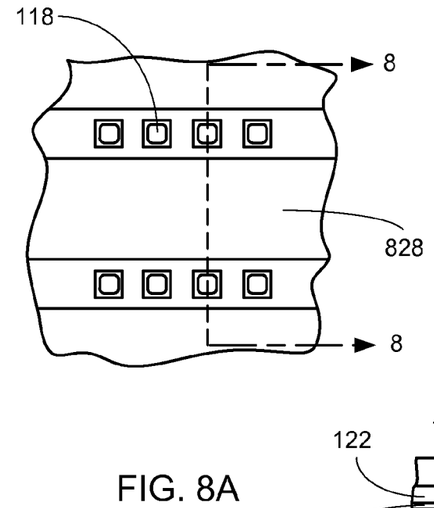
FIG. 8A is a top view of a photoresist and the bit line contact plug in a bit trench formation phase of manufacturing.

Referring now to FIG. 8A, therein is shown a top view of a photoresist 828 and the bit line contact plug 118 in a bit trench formation phase of manufacturing. The bit line contact plug 118 is shown as exposed from the photoresist 828.

Figure 8B:
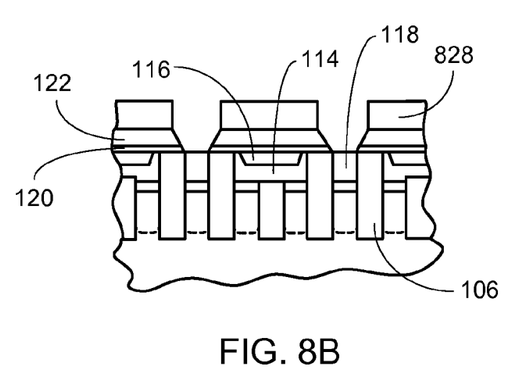
FIG. 8B is a cross-sectional view of the photoresist and the bit line contact plug along the section line 8-8 of FIG. 8A.

Referring now to FIG. 8B, therein is shown a cross-sectional view of the photoresist 828 and the bit line contact plug 118 along the section line 8-8 of FIG. 8A. Prior to application of the photoresist 828, the lower dielectric layer 120 and the upper dielectric layer 122 are deposited over the resistive or capacitive film 114, the metal film 116, the bit line contact plug 118, and the isolation region 106 using a process such as CVD. The photoresist 828 can then be patterned on the upper dielectric layer 122 using lithography to cover the upper dielectric layer 122 but not an area around the bit line contact plug 118. The photoresist 828 can be patterned to leave a bit trench area that leaves the bit line contact plug 118 exposed.

The photoresist 828 is used as a mask for etching the upper dielectric layer 122 and the lower dielectric layer 120. The upper dielectric layer 122 and the lower dielectric layer 120 can be removed through a process such as dry etching if the layers are formed from silicon nitride and silicon dioxide, respectively, for example.

It has been discovered that covering the resistive or capacitive film 114 and the metal film 116, which help form the resistor or capacitor, with the lower dielectric layer 120 and the upper dielectric layer 122, isolates the resistor or capacitor from the outside environment. For example, the resistor or capacitor can be protected from oxidization, etchants, plasma if used in the etch process, or other environmental hazards due to being isolated from the outside.

In order to form the semiconductor memory system 100 of FIGS. 1A and 1B, further manufacturing steps are necessary. For example, the photoresist 828 can be stripped, and the entire top surface can be covered by the isolation layer 104 of FIG. 1A deposited through a process such as CVD. The photoresist 828 can be applied again, with a pattern corresponding to the bit line 102 of FIG. 1A. This step can be followed by another dry etching step to remove the isolation layer 104 over the bit line contact plug 118, followed by stripping the photoresist 828. A conductive material such as copper, aluminum, or tungsten can be deposited to form the bit line 102. A protective conductive liner (not shown) can be deposited prior to the deposition of the bit line 102. The top surface can then be planarized with a process such as CMP to complete the manufacturing of the semiconductor memory system 100 of FIGS. 1A and 1B.

Thus, it has been discovered that the semiconductor memory system and method of manufacture thereof of the present invention furnishes important and heretofore unknown and unavailable solutions, capabilities, and functional aspects for manufacturing reliable and compact semiconductor memory systems with high memory density.

Figure 9:
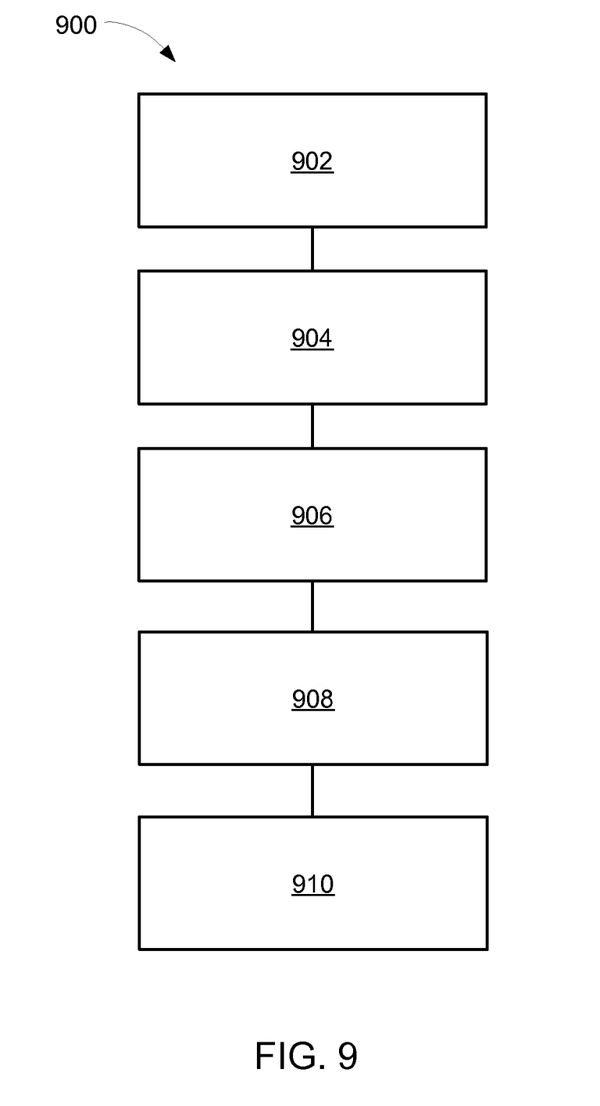
FIG. 9 is a flow chart of a method of manufacture of the semiconductor memory system in a further embodiment of the present invention.

Referring now to FIG. 9, therein is shown a flow chart of a method 900 of manufacture of the semiconductor memory system 100 in a further embodiment of the present invention. The method 900 includes: forming an isolation region having contact holes on a base wafer including forming an ion implanted region in the contact holes in a block 902; depositing a bit line contact plug in one of the contact holes in a block 904; removing a portion of the isolation region from between the bit line contact plug and another of the bit line contact plug including forming an isolation sidewall of the isolation region in direct contact with sides of the bit line contact plug in a block 906; forming a resistor or capacitor on the isolation sidewall opposite the bit line contact plug between the bit line contact plug and another of the bit line contact plug in a block 908; and forming a bit line on the bit line contact plug and over the resistor or capacitor in a block 910.

The resulting method, process, apparatus, device, product, and/or system is straightforward, cost-effective, uncomplicated, highly versatile and effective, can be surprisingly and unobviously implemented by adapting known technologies, and are thus fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of a semiconductor memory system comprising:
    forming isolation regions having contact holes on a base wafer including forming an ion implanted region in the contact holes;
    depositing a bit line contact plug in one of the contact holes;
    removing a portion of the isolation regions from between the bit line contact plug and another of the bit line contact plug including forming isolation sidewalls of the isolation regions in direct contact with sides of the bit line contact plug;
    forming a resistor or capacitor on the isolation sidewalls opposite to the bit line contact plug between the bit line contact plug and another of the bit line contact plug; and
    forming a bit line on the bit line contact plug and the another of the bit line contact plug and over the resistor or capacitor;
    wherein forming the resistor or capacitor includes:
    depositing a resistive or capacitive film on the isolation sidewalls between the bit line contact plug and the another of the bit line contact plug;
    depositing a metal film on the resistive or capacitive film; and
    planarizing a top surface of the isolation region, the bit line contact plug, the resistive or capacitive film, and the metal film.

2. The method as claimed in claim 1 wherein forming the bit line on the bit line contact plug includes forming a self-aligned bit line.

3. The method as claimed in claim 1 further comprising forming a node contact on the ion implanted region in the contact holes.

4. The method as claimed in claim 1 further comprising:
    depositing a lower dielectric layer on the isolation regions and the resistor or capacitor; and
    depositing an upper dielectric layer on the lower dielectric layer.

5. The method as claimed in claim 1 further comprising:
    forming a node contact on the ion implanted region in the contact holes;
    depositing a lower dielectric layer on the isolation regions and the resistor or capacitor; and
    depositing an upper dielectric layer on the lower dielectric layer; and wherein depositing a bit line contact plug in one of the contact holes includes:
depositing a bit line contact plug on the node contact in one of the contact holes over the ion implanted region.

6. The method as claimed in claim 5 further comprising:
patterning a photoresist on the upper dielectric layer;
removing the upper dielectric layer and the lower dielectric layer over the bit line contact plug; and
removing the photoresist.

7. The method as claimed in claim 5 wherein forming the bit line on the bit line contact plug includes patterning the lower dielectric layer and the upper dielectric layer for exposing the bit line contact plug.

8. The method as claimed in claim 5 wherein forming the isolation sidewalls includes exposing the node contact.

9. The method as claimed in claim 5 further comprising depositing an isolation layer over the lower dielectric layer.

10. A semiconductor memory system comprising:
a base wafer;
isolation regions on the base wafer;
an ion implanted region on the base wafer separated by the isolation regions;
a bit line contact plug over the ion implanted region;
isolation sidewalls on the sides of the bit line contact plug;
a resistor or capacitor on the isolation sidewalls opposite to the bit line contact plug between the bit line contact plug and another of the bit line contact plug, the resistor or capacitor including:
a resistive or capacitive film on the isolation sidewalls opposite to the bit line contact plug between the bit line contact plug and another of the bit line contact plug, and
a metal film on the resistive or capacitive film between the bit line contact plug and the another of the bit line contact plug; and
a bit line over the resistor or capacitor and on the bit line contact plug and the another of the bit line contact plug.

11. The system as claimed in claim 10 further comprising a node contact between and on the ion implanted region and the bit line contact plug.

12. The system as claimed in claim 10 wherein the bit line contact plug and the bit line form a self-aligned bit line.

13. The system as claimed in claim 10 wherein the resistor or capacitor on the isolation sidewalls opposite to the bit line contact plug is a self-aligned resistor or capacitor.

14. The system as claimed in claim 10 further comprising:
a node contact between and on the ion implanted region and the bit line contact plug;
a lower dielectric layer on the isolation regions, the metal film, and the resistive or capacitive film; and
an upper dielectric layer on the lower dielectric layer.

15. The system as claimed in claim 14 further comprising a protective conductive liner on the bit line contact plug and the bit line.

16. The system as claimed in claim 14 wherein the resistive or capacitive film and the metal film are protected from oxidation and etching damage by the lower dielectric layer and the upper dielectric layer.

17. The system as claimed in claim 14 wherein the resistive or capacitive film is a metal oxide or an electrolyte film for forming a resistor.

18. The system as claimed in claim 14 wherein the resistive or capacitive film is a high-k dielectric for forming a capacitor.

* * * * *